(12) United States Patent
Tanaka

(10) Patent No.: US 10,390,403 B2
(45) Date of Patent: Aug. 20, 2019

(54) POWER SUPPLY DEVICE USED FOR LED LIGHT OUTPUT DEVICE

(71) Applicant: CCS Inc., Kyoto-shi, Kyoto (JP)

(72) Inventor: Yuichiro Tanaka, Kyoto (JP)

(73) Assignee: CCS INC., Kyoto-Shi, Kyoto (JP)

( * ) Notice: Subject to any disclaimer, the term of this patent is extended or adjusted under 35 U.S.C. 154(b) by 0 days.

(21) Appl. No.: 16/073,122

(22) PCT Filed: Jan. 25, 2017

(86) PCT No.: PCT/JP2017/002515
§ 371 (c)(1),
(2) Date: Jul. 26, 2018

(87) PCT Pub. No.: WO2017/131020
PCT Pub. Date: Aug. 3, 2017

(65) Prior Publication Data
US 2019/0045597 A1 Feb. 7, 2019

(30) Foreign Application Priority Data
Jan. 27, 2016 (JP) .................. 2016-013036

(51) Int. Cl.
*H05B 33/08* (2006.01)
*H01L 33/00* (2010.01)
*H05B 33/06* (2006.01)

(52) U.S. Cl.
CPC ......... *H05B 33/0848* (2013.01); *H01L 33/00* (2013.01); *H05B 33/06* (2013.01); *H05B 33/0815* (2013.01)

(58) Field of Classification Search
CPC ............ H05B 33/0848; H05B 33/0815; H05B 33/0803; H05B 33/0818; H05B 33/0821;
(Continued)

(56) References Cited

U.S. PATENT DOCUMENTS 6,400,101 B1 * 6/2002 Biebl ................ H05B 33/0818
315/185 R
6,897,623 B2 * 5/2005 Yoneda ............. H05B 33/0848
315/119

(Continued)

FOREIGN PATENT DOCUMENTS

JP 2005093196 A 4/2005
JP 2012134153 A 7/2012
JP 2014079043 A 5/2014

OTHER PUBLICATIONS

ISA Japan Patent Office, International Search Report Issued in Application No. PCT/JP2017/002515, dated Mar. 14, 2017, WIPO, 4 pages.

*Primary Examiner* — Tung X Le
*Assistant Examiner* — Boma Alaeddini
(74) *Attorney, Agent, or Firm* — Alleman Hall Creasman & Tuttle LLP

(57) ABSTRACT

In order that a power supply device capable of identifying the type of a connected LED light output device and outputting voltage or current suitable therefor completely eliminates the need to provide an additional circuit for the type identification on the LED light output device side and requires only a power supply cable for the connection, in an unconnected state with the LED light output device, electrical continuity between a second terminal to be connected to the cathode of an LED and a ground is cut, and when a transition from the unconnected state to a connected state is made, the voltage of the second terminal is measured to, on the basis of the measured voltage, identify the type of the connected LED light output device with the electrical continuity between the second terminal and the ground kept cut.

3 Claims, 4 Drawing Sheets

(58) Field of Classification Search
CPC ............ H05B 33/0827; H05B 33/0845; H05B 33/0857; H05B 33/086; H05B 33/0866; H05B 33/0887; H05B 33/08
See application file for complete search history.

(56) References Cited

U.S. PATENT DOCUMENTS

| | | | | |
|---|---|---|---|---|
| 8,698,427 | B2* | 4/2014 | Dari | H05B 33/0848 315/186 |
| 8,710,750 | B2* | 4/2014 | Nonaka | H05B 33/0815 315/185 S |
| 8,963,445 | B2* | 2/2015 | Baccarin | H05B 33/0845 307/10.1 |
| 2004/0090189 | A1* | 5/2004 | Yoneda | H05B 33/0848 315/291 |
| 2005/0062445 | A1* | 3/2005 | Toyota | H05B 33/0803 315/312 |
| 2010/0072898 | A1* | 3/2010 | Ohashi | H05B 33/0818 315/127 |
| 2015/0250036 | A1* | 9/2015 | Ueda | H05B 33/0815 315/178 |
| 2015/0373811 | A1* | 12/2015 | Dunser | H05B 33/0815 315/185 R |
| 2016/0021712 | A1* | 1/2016 | Nakamura | H05B 33/0809 315/82 |

* cited by examiner

POWER SUPPLY DEVICE USED FOR LED LIGHT OUTPUT DEVICE

TECHNICAL FIELD

The present invention relates to a power supply device for supplying electric power to an LED light output device used for surface inspection and the like, and in particular, to a power supply device capable of being used commonly by various LED light output devices having different specified voltages and/or specified currents.

BACKGROUND ART

This sort of power supply device automatically identifies the type of a connected LED light output device, and outputs a voltage or a current suitable for the LED light output device. For this reason, a conventional LED light output device is preliminarily given an identifier for indicating the type thereof, and the power supply device is adapted to read the identifier upon connection and identify the type of the LED light output device.

For example, in Patent Literature 1, an LED light output device is added with a resistive element for type identification, and a power supply device reads the value of the resistive element upon connection to identify the type of the LED light output device.

However, such a configuration requires providing an identifier (e.g., the above-described resistive element) on the LED light output device side, and also requires, in addition to an electric power supply cable, a communication cable for reading the identifier as a connection cable between the LED light output device and the power supply device.

CITATION LIST

Patent Literature

Patent Literature 1
Japanese Unexamined Patent Publication JP-A2005-93196

SUMMARY OF INVENTION

Technical Problem

The present invention has been made in order to solve such a problem, and in order that a power supply device capable of identifying the type of a connected LED light output device and outputting a voltage or a current suitable therefor to completely eliminate the need to provide an additional circuit for the type identification on the LED light output device side and requires only a power supply cable for the connection.

Solution to Problem

Since an LED inevitably has a parasitic capacitance, as illustrated in FIG. 1, when with the cathode of the LED substantially opened, applying a voltage $V_o$ to the anode, a current $I_j$ corresponding to a parasitic capacitance $C_j$ of the LED flows through the LED, and a potential difference $V_f$ corresponding to the current $I_j$ is generated between the anode and cathode of the LED.

Since the parasitic capacitance $C_j$ is a specific one that is different depending on the type and connecting configuration of an LED, when measuring a potential $V_m$ of the cathode in this state, the potential difference $V_f$ between the anode and the cathode can be known from $V_m$, and the type and connecting configuration of the LED can be known. Further, ultimately, the type of the connected LED light output device can be known.

The present inventor has completed the present invention on the basis of such knowledge.

That is, a power supply device according to the present invention is adapted to supply electric power to an LED of an LED light output device via two electric power lines including a positive wire and a negative wire and one including: a first terminal to be connected to the anode of the LED via the positive wire; a second terminal to be connected to the cathode of the LED via the negative wire; a voltage source that applies a predetermined voltage to the first terminal; an electrical conduction control element that is provided between the second terminal and a ground to control an electrical conduction state therebetween; a voltage measurement circuit that measures a voltage of the second terminal; and an identification part that identifies the type of the LED light output device connected.

In addition, the identification part, in an unconnected state that is a state of not being connected to the LED light output device, controls the electrical conduction control element to cut electrical continuity, maintained by the electrical conduction control element, between the second terminal and the ground, and when a transition from the unconnected state to a connected state of being connected to the LED light output device is made, acquires the voltage measured by the voltage measurement circuit to, on the basis of the measured voltage, identify the type of the connected LED light output device with the electrical continuity between the second terminal and the ground kept cut.

In such a configuration, when the transition from the unconnected state to the connected state is made, the anode of the LED is applied with the predetermined voltage via the positive wire, whereas the cathode of the LED is connected with the second terminal via the negative wire; however, since the electrical continuity is cut by the electrical conduction element, the second terminal and the ground are in an opened state, and therefore the same state as in the above-described knowledge by the present inventor is produced.

Accordingly, by measuring the voltage of the second terminal, which is the same as the cathode voltage of the LED, the type of the connected LED light output device can be identified.

In addition, for the identification, it is only necessary to connect the power supply device and the LED light output device via the two electric power lines including the positive wire and the negative wire, but it is unnecessary to provide a dedicated electric wire for the identification, as well as to provide an additional circuit for the type identification on the LED light output device side at all, so that the very simple configuration makes it possible to identify the LED light output device.

Further, since when identifying the type of the LED light output device, the connected LED light output device is not identified at this point in time, voltage exceeding a specified one seems to be applied to the LED from the voltage source; however, the anode of the LED is opened, and therefore excessive voltage is never applied between the anode and cathode of the LED at the time of the identification.

As described above, it is only necessary that after identifying the LED light output device, the identification part controls the voltage source to set a voltage to be applied to the LED light output device.

By configuring the voltage measurement circuit to output 0 V as the measured voltage in the unconnected state, and configuring the identification part to, on the basis of whether or not the measured voltage is 0 V, determine whether or not the LED light output device is in the unconnected state, the need for a dedicated circuit for the connection/unconnection determination is eliminated to omit an unnecessary configuration.

Advantageous Effects of Invention

Only connecting via the two electric power lines including the positive wire and the negative wire enables the type of the LED light output device to be identified.

LIST OF REFERENCE CHARACTERS

Figure 1:
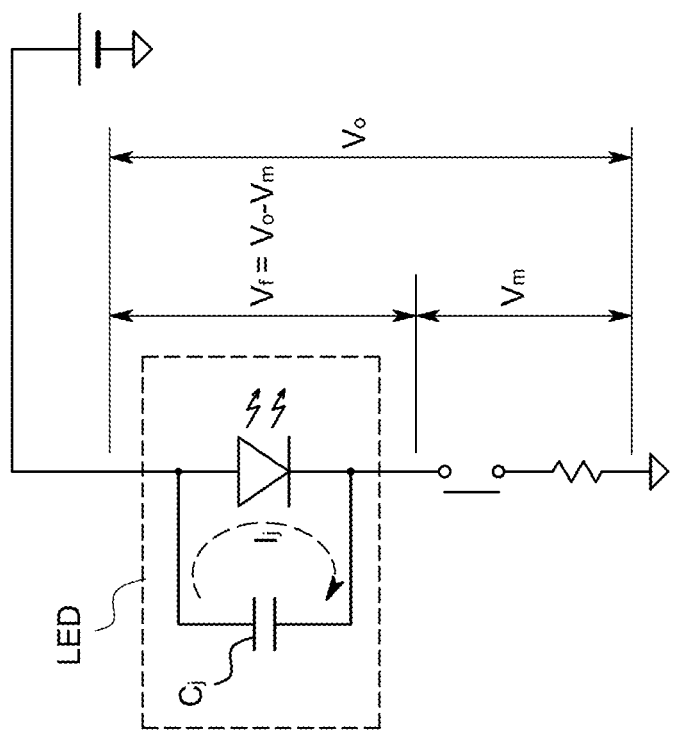
FIG. 1 is a schematic circuit diagram illustrating the principle of the present invention.

1 LED light output device
11 LED
2 Power supply device
21 Voltage source
221 Electrical conduction control element (MOSFET)
23 Voltage measurement circuit
243 Identification part
25a First terminal
25b Second terminal

DESCRIPTION OF EMBODIMENTS

One embodiment of the present invention will be described with reference to drawings.

Figure 2:
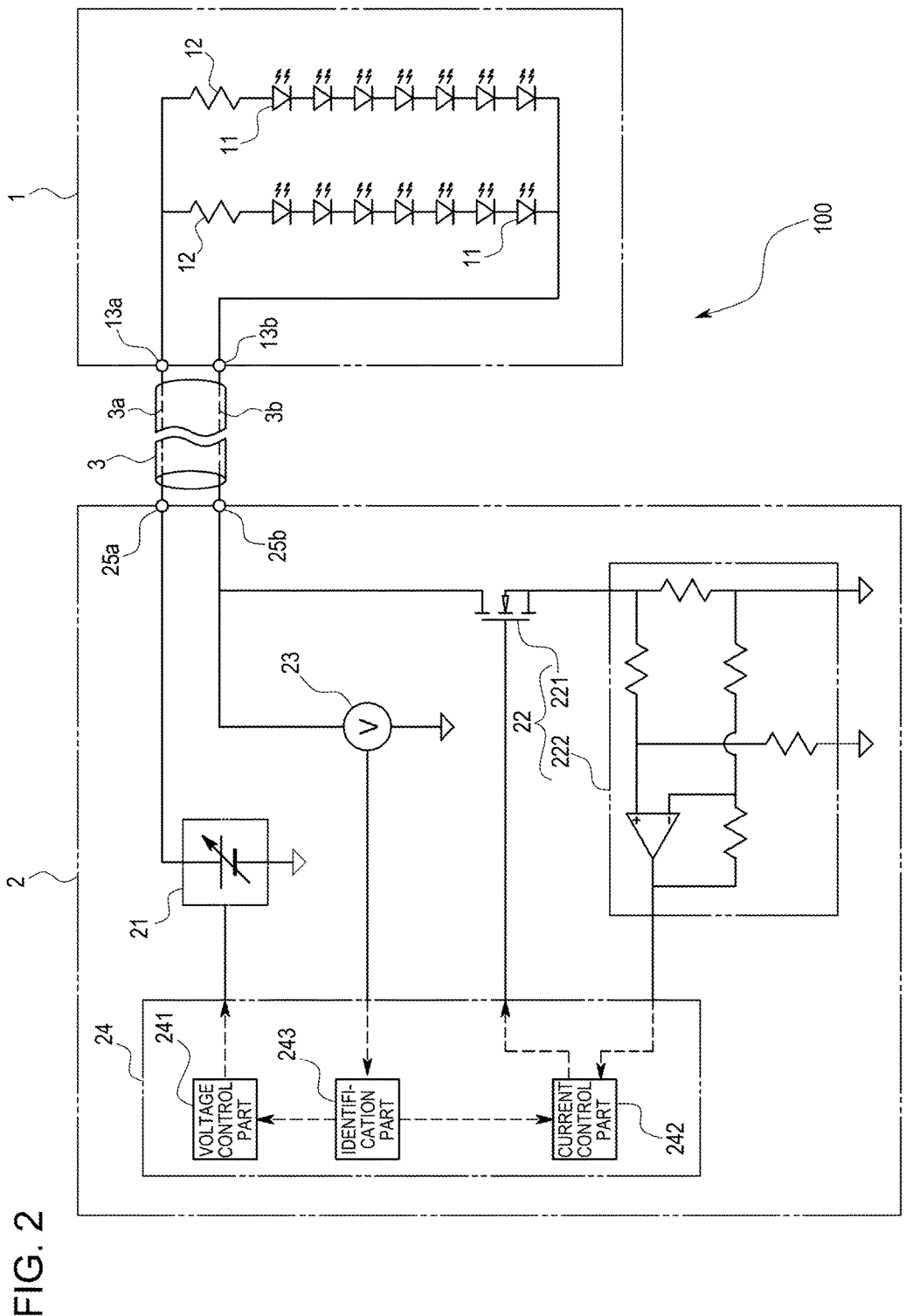
FIG. 2 is a circuit diagram of an LED lighting system in one embodiment of the present invention.

An LED lighting system 100 in this embodiment, as illustrated in FIG. 2, includes: an LED light output device 1 used for, for example, the surface inspection of various workpieces; and a power supply device 2 connected to the LED light output device 1 via an electric cable 3 including a positive wire 3a and a negative wire 3b.

The LED light output device 1 includes: a positive terminal 13a and a negative terminal 13b respectively connected with the positive wire 3a and the negative wire 3b via a connector; and multiple LEDs 11 disposed in series between the positive terminal 13a and the negative terminal 13b. Further, electric power is supplied to the LEDs 11 from the power supply device 2 to thereby light the LEDs 11, and their light is configured to be outputted toward a workpiece.

To describe more specifically, the positive terminal 13a is connected with the anode of the LED 11 at one end of the LEDs 11 in series via a resistive element 12 for current control, and the negative terminal 13b is directly connected with the cathode of the LED 11 at the other end of the LEDs 11 in series. Note that the resistive element 12 may be disposed at any position as long as the position is in series with the LEDs 11.

The power supply device 2 includes: a connector having a first terminal 25a and a second terminal 25b respectively connected to the positive terminal 13a and the negative terminal 13b of the LED light output device 1; a voltage source 21 connected to the first terminal 25a; a current regulation circuit 22 connected to the second terminal 25b; and a processing circuit 24.

The voltage source 21 is a DC voltage source 21 typified by, for example, a DC-DC converter, an AC-DC converter, or the like, and here configured to be able to change its output voltage in accordance with the value of an externally inputted voltage command signal.

The current regulation circuit 22 includes: a MOSFET (metal-oxide-semiconductor field-effect transistor) 221 as an electrical conduction control element provided between the second terminal 25b and a ground; and a current monitoring circuit 222 adapted to monitor current flowing to the ground through the MOSFET 221.

The processing circuit 24 is an analog/digital mixed circuit including an unillustrated CPU, memory, an AD converter, a DA converter, an amplifier, and the like, and by making the CPU and its peripheral devices cooperate in accordance with a predetermined program stored in the memory, fulfills functions as: a voltage control part 241 that outputs the voltage command signal to control the output voltage of the voltage source 21; a current control part 242 that outputs a current command signal to control current from the current regulation circuit 22; and the like.

Further, by connecting the power supply device 2 having such a configuration to the LED light output device 1 via the electric cable 3, the LED light output device 1 is configured to be capable of lighting in a desired mode.

In addition, in the LED lighting system 100 configured as described, in this embodiment, the power supply device 2 is provided with: a voltage measurement circuit 23 adapted to measure the voltage of the second terminal 25b thereof; and an identification part 243 adapted to identify the type of the connected LED light output device 1.

The respective parts will be described.

Figure 3:
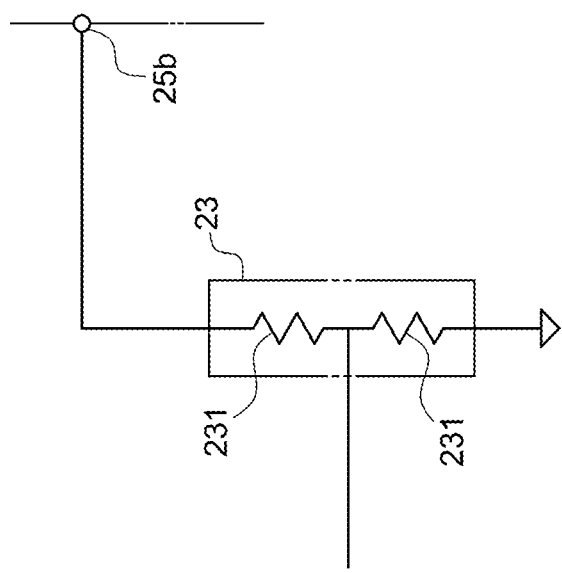
FIG. 3 is a circuit diagram of a voltage measurement circuit in the same embodiment.

The voltage measurement circuit 23, for example, as illustrated in FIG. 3, includes one or more resistive elements 231 provided between the second terminal 25b and the ground and having a sufficiently high resistance value, and configured to be able to measure the voltage of the second terminal 25b as voltage at the end opposite to the ground end of the resistive elements 231. The "sufficiently high resistance value" refers to a resistance value enough to cause current flowing through a resistive element to have a substantially negligible value.

The function of the identification part 243 here is carried by the processing circuit 24. The following will specifically describe the function while describing operation.

The identification part 243 monitors the voltage measured by the voltage measurement circuit 23, and on the basis of the value of the measured voltage, detects whether or not the LED light output device 1 is connected. That is, when the connection is lost, the output of the voltage measurement circuit 23 becomes zero, whereas when the connection is established, some voltage is generated, and therefore when the voltage measured by the voltage measurement circuit 23 is zero, the identification part 243 determines to be in an unconnected state where the connection with the LED light output device 1 is lost, and when not, determines to be in a connected state.

Figure 4:
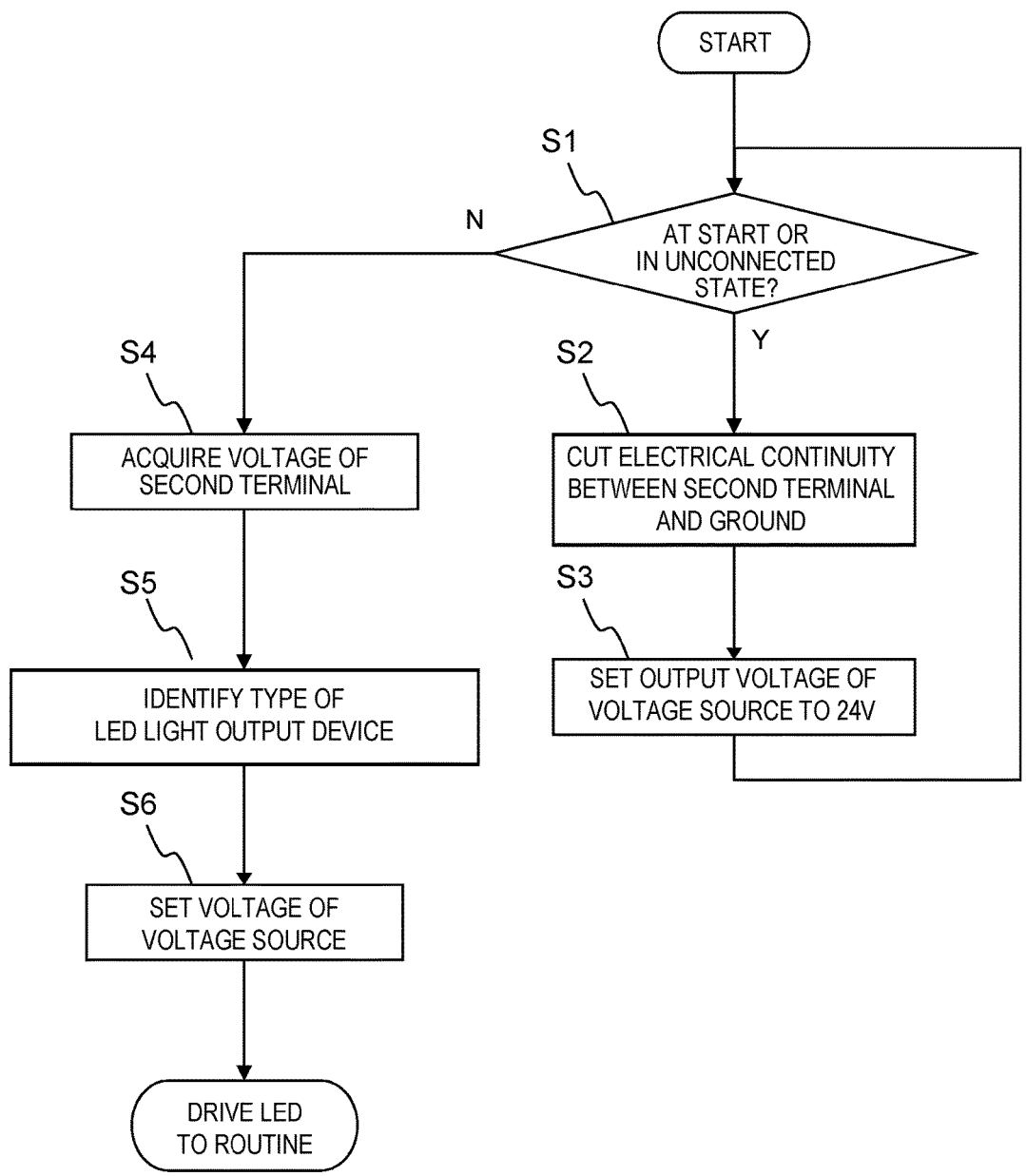
FIG. 4 is a flowchart illustrating the operation of an identification part in the same embodiment.

Further, when the identification part 243 determines to be in the unconnected state or at a start (FIG. 4: Step S1), it controls the MOSFET 221 to cut electrical continuity via the MOSFET 221 between the second terminal 25b and the ground (FIG. 4: Step S2).

Also, at the same time, the identification part 243 controls the voltage source 21 to set its output voltage to a predetermined initial voltage (here, for example, 24 V) (FIG. 4: Step S3).

Subsequently, when the electric cable 3 is connected in the unconnected state to transition to the connected state of being connected to the LED light output device 1, the identification part 243 having sensed this acquires the voltage measured by the voltage measurement circuit 23 while keeping the states of the MOSFET 221 and voltage source 21 the same as those in the unconnected state (FIG. 4: Step S4).

Then, on the basis of the measured voltage, it identifies the type of the connected LED light output device 1 (FIG. 4: Step S5).

The reason that the type of the LED light output device 1 can be identified on the basis of the measured voltage is as follows.

As described above, even when in a state where the anode of the LEDs 11 is applied with a constant voltage and the cathode is opened, no current substantially flows through the LEDs 11, a potential difference is generated between the anode and cathode of the LEDs 11 because of the parasitic capacitance of the LEDs 11. Since the parasitic capacitance is a specific one determined by the type and connecting configuration of the LEDs 11, and the potential difference is different depending on the parasitic capacitance, ultimately, the potential difference is different depending on the type of the LED light output device 1.

Further, since the potential difference is the difference between the applied voltage to the anode by the voltage source 21 and the measured voltage by the voltage measurement circuit, and in this embodiment, the applied voltage to the anode is kept constant (24 V), ultimately, the measured voltage is different depending on the type of the LED light output device 1. This is the reason why the type of the LED light output device 1 can be identified on the basis of the measured voltage.

Here, for example, the types of LED light output devices 1 and measured voltages determined for the respective types of the LED light output devices 1 are preliminarily linked to each other and stored in a table set in a predetermined area of the memory, and the identification part 243 identifies the type of the connected LED light output device 1 by referring to the table to identify the LED light output device 1 corresponding to the measured voltage.

Then, the identification part 243 controls the voltage source 21 to set its output voltage to voltage corresponding to the connected LED light output device 1 (FIG. 4: Step S6). Specifically, applied voltages for the respective types of the LED light output devices 1 are stored in a table, and the identification part 243 refers to the table to set the output voltage of the voltage source 21.

After setting the voltage of the voltage source 21 in this manner, the power supply device 2 drives the LED light output device 1 as has been known. In this example, the brightness of the LED light output device 1 is adjusted by controlling a PWM (Pulse Width Modulation) ratio or the value of continuous current, or the LED light output device 1 is made to stroboscopically emit light by increasing the applied voltage.

On the other hand, when a transition is made from the connected state to the unconnected state by, for example, removing the connector or other means, the identification part 243 detects this, and as described above, controls the MOSFET 221 to cut the electrical continuity between the second terminal 25b and the ground (FIG. 4: Step S2), as well as controls the voltage source 21 to set its output voltage to the initial voltage (FIG. 4: Step S3).

That is, in such a configuration, when identifying the LED light output device 1, it is only necessary to connect the power supply device 2 and the LED light output device 1 via the two power lines including the positive wire 3a and the negative wire 3b, but it is unnecessary to provide a dedicated electric wire for the identification, as well as to provide an additional circuit for the type identification on the LED light output device 1 side at all. Accordingly, the very simple configuration makes it possible to identify the LED light output device 1.

Note that the present invention is not limited to the above-described embodiment.

For example, the number of LEDs of the LED light output device may be one.

In addition, the LED light output device is not only one for work surface inspection as in the above-described embodiment but may be one that outputs ultraviolet light, like one for, for example, photolithographic exposure.

Furthermore, it is needless to say that the present invention is not limited to the above-described embodiment, but can be variously modified without departing from the scope thereof.

INDUSTRIAL APPLICABILITY

According to the present invention, the power supply device capable of identifying the type of a connected LED light output device and outputting a voltage or a current suitable for it can completely eliminate the need to provide an additional circuit for the type identification on the LED light output device side and require only a power supply cable for the connection.

The invention claimed is:
1. A light-emitting diode (LED) lighting system comprising an LED light output device that does not include an identification resistor configured to identify a type of the LED light output device, and a power supply device adapted to supply electric power to an LED of the LED light output device via two electric power lines including a positive wire and a negative wire, the power supply device comprising:
 a first terminal to be connected to an anode of the LED via the positive wire;
 a second terminal to be connected to a cathode of the LED via the negative wire;
 a voltage source that applies a predetermined voltage to the first terminal;
 an electrical conduction control element that is provided between the second terminal and a ground to control an electrical conduction state therebetween;
 a voltage measurement circuit that measures a voltage of the second terminal; and
 an identification part that identifies the type of the LED light output device connected, wherein
 the identification part, in an unconnected state that is a state of not being connected to the LED light output device, controls the electrical conduction control element to cut electrical continuity, maintained by the electrical conduction control element, between the second terminal and the ground, and when a transition from the unconnected state to a connected state of being connected to the LED light output device is made, acquires the voltage measured by the voltage measurement circuit to, on a basis of the measured voltage, identify the type of the connected LED light output device with the electrical continuity between the second terminal and the ground kept cut.

2. The power supply device according to claim 1, wherein the identification part, after identifying the type of the connected LED light output device in the connected state, controls the voltage source to set a voltage to be applied to the LED light output device.

3. The power supply device according to claim 1, wherein the voltage measurement circuit outputs 0 V as the measured voltage in the unconnected state, and the identification part, on a basis of whether or not the measured voltage is 0 V, determines whether or not the LED light output device is in the unconnected state.

* * * * *